(12) United States Patent
Hsieh et al.

(10) Patent No.: US 8,149,498 B2
(45) Date of Patent: Apr. 3, 2012

(54) PACKAGE STRUCTURE OF A FLEXIBLE DISPLAY DEVICE

(75) Inventors: Ming-Che Hsieh, Hsin-Chu (TW);
Shih-Hsing Hung, Hsin-Chu (TW);
Chih-Jen Hu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 107 days.

(21) Appl. No.: 12/870,845

(22) Filed: Aug. 29, 2010

(65) Prior Publication Data

US 2011/0235160 A1   Sep. 29, 2011

(30) Foreign Application Priority Data

Mar. 23, 2010   (TW) ................. 99108475 A

(51) Int. Cl.
*G02B 26/00* (2006.01)
*H01L 23/02* (2006.01)

(52) U.S. Cl. ........................ 359/296; 257/687
(58) Field of Classification Search ............ 257/687, 257/751; 313/512; 345/107; 349/122; 359/296; 428/1.5
See application file for complete search history.

(56) References Cited

U.S. PATENT DOCUMENTS

| 6,906,851 | B2 |    | 6/2005 | Yuasa |
|---|---|---|---|---|
| 7,876,493 | B2 | * | 1/2011 | Park et al. ............ 359/296 |
| 7,907,329 | B2 | * | 3/2011 | Lee et al. ............ 359/296 |
| 2005/0179852 | A1 |  | 8/2005 | Kawai |
| 2007/0211002 | A1 |  | 9/2007 | Zehner |
| 2008/0138633 | A1 |  | 6/2008 | Park |
| 2010/0264817 | A1 | * | 10/2010 | Bouten et al. ............ 313/512 |

FOREIGN PATENT DOCUMENTS

| CN | 2768128 Y | 3/2006 |
|---|---|---|
| CN | 101236346 A | 8/2008 |
| TW | 200638791 A | 11/2006 |
| TW | 200712641 | 4/2007 |
| TW | 200813588 | 3/2008 |
| TW | 200813590 | 3/2008 |
| TW | 200841500 | 10/2008 |

* cited by examiner

*Primary Examiner* — David N Spector
(74) *Attorney, Agent, or Firm* — Winston Hsu; Scott Margo

(57) ABSTRACT

A package structure of flexible display device includes a flexible opto-electronic display panel, a first barrier layer and a second barrier layer. The flexible opto-electronic display panel includes a backplane, a flexible frontplane, and a display media layer. The display media layer is disposed between the flexible frontplane and the backplane, where the display media layer is substantially corresponding to a display region of the backplane, and at least one side of the display media layer aligns with one corresponding side of the backplane. The first barrier layer is disposed on a first surface of the flexible frontplane, where the flexible frontplane, the display media layer and the first barrier layer expose a bonding region of the backplane. The second barrier layer is disposed on a second surface of the backplane.

22 Claims, 16 Drawing Sheets

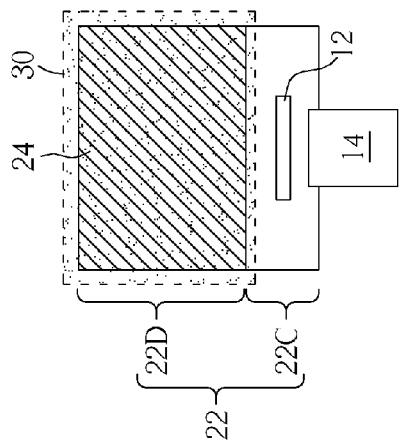
FIG. 1B
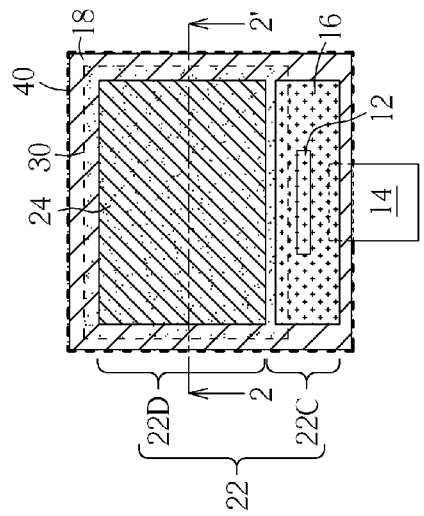
FIG. 1D
FIG. 1A
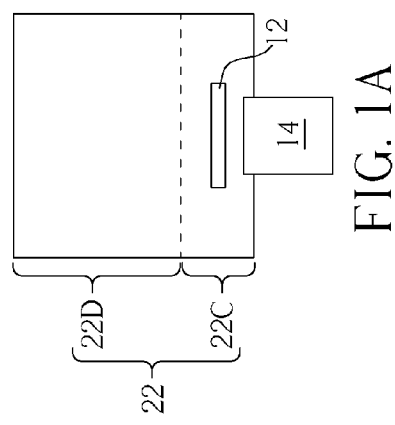
FIG. 1C

PACKAGE STRUCTURE OF A FLEXIBLE DISPLAY DEVICE

BACKGROUND OF THE INVENTION

1. Field of the Invention

The present invention relates to a package structure of a flexible display device, and more particularly, to a package structure of a flexible display device with high protection effect.

2. Description of the Prior Art

Reading words or pictures printed on papers is the most well-accepted reading method for human beings. As paper printing techniques advance and printing costs reduce, papers have been extensively used as data record media. However, as display technique advances, it is made possible that in the near future, papers may be replaced by a flexible display device. Like papers, the flexible display device is thin in profile, small in size, light in weight, easy to carry and flexible in shape; therefore, it is expected that the flexible display device can be applied in electronic papers or electronic books, replacing conventional papers and books.

In a flexible display device, display components are formed between flexible back-plate and flexible front-plate, such that the flexible display device can possess flexible property. The flexible back-plate and front-plate, however, are normally organic soft substrates or ultra thin metal substrates. These types of materials are highly sensitive to water vapor in the environment, and are thus apt to be damaged. In the conventional package structure of flexible display device, only one encapsulation layer is used to isolate the flexible display device from water vapor. One encapsulation layer cannot provide sufficient sealing and protection effects, and thus the reliability of the conventional flexible display device needs to be improved.

SUMMARY OF THE INVENTION

It is therefore one of the objectives of the present invention to provide a package structure of a flexible display device with high reliability and airtightness.

According to the present invention, a package structure of a flexible display device is provided. The package structure of the flexible display device includes a flexible opto-electronic display panel, a first barrier layer and a second barrier layer. The flexible opto-electronic display panel includes a backplane, a flexible frontplane and a display media layer. The backplane includes a first surface and a second surface, and further includes a display region and at least one bonding region defined on the first surface of the backplane. The display region includes an array layer. The flexible frontplane faces the first surface of the backplane, wherein the flexible frontplane includes a first surface and a second surface, and the second surface of the flexible frontplane faces the first surface of the backplane. The display media layer is disposed between the flexible frontplane and the backplane, wherein the display media layer is substantially corresponding to the display region of the backplane, and at least one side of the display media layer aligns with one corresponding side of the backplane. The first barrier layer is disposed on the first surface of the flexible frontplane, wherein the flexible frontplane, the display media layer and the first barrier layer expose the bonding region of the backplane. The second barrier layer is disposed on the second surface of the backplane.

According to the present invention, another package structure of a flexible display device is provided. The package structure of the flexible display device includes a flexible opto-electronic display panel, a first barrier layer, a top protection layer and an exterior film. The flexible opto-electronic display panel includes a backplane, a flexible frontplane and a display media layer. The backplane includes a first surface and a second surface, and further includes a display region and at least one bonding region defined on the first surface of the backplane. The display region includes an array layer. The flexible frontplane faces the first surface of the backplane, wherein the flexible frontplane comprises a first surface and a second surface, and the second surface of the flexible frontplane faces the first surface of the backplane. The display media layer is disposed between the flexible frontplane and the backplane, wherein the display media layer is substantially corresponding to the display region of the backplane, and at least one side of the display media layer aligns with one corresponding side of the backplane. The first barrier layer is disposed on the first surface of the flexible frontplane, wherein the flexible frontplane, the display media layer and the first barrier layer expose the bonding region of the backplane. The top protection layer is disposed on the first barrier layer, wherein at least one side of the first barrier layer and at least one side of the top protection layer align with the display media layer. The exterior film is disposed on the top protection layer, wherein at least one side of the exterior film protrudes from the top protection layer.

The package structure of the flexible display device of the present invention is able to provide adequate protection. In addition, the package structure of the flexible display device of the present invention further includes an encapsulation layer surrounding the opto-electronic display panel, so as to enhance the sealing effect.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-1D and FIG. 2 are schematic diagrams illustrating a package structure of a flexible display device according to a first preferred embodiment of the present invention.

DETAILED DESCRIPTION

To provide a better understanding of the presented invention, preferred embodiments will be made in details. The preferred embodiments of the present invention are illustrated in the accompanying drawings with numbered elements.

Figure 2:
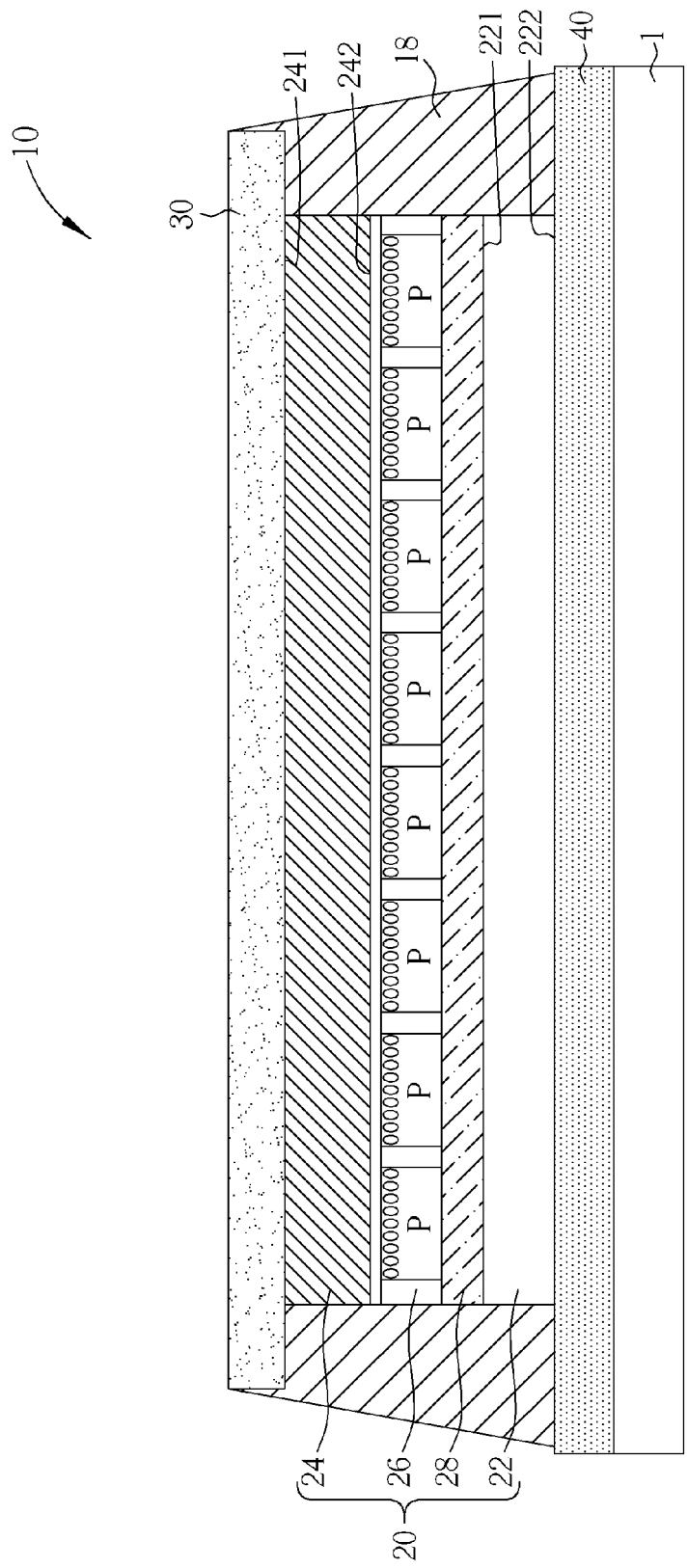

Please refer to FIGS. 1A-1D and FIG. 2. FIGS. 1A-1D and FIG. 2 are schematic diagrams illustrating a package structure of a flexible display device according to a first preferred embodiment of the present invention. To clearly demonstrate the relative position between the different layers of the package structure of the flexible display device, FIGS. 1A-1D are top-views respectively illustrating the package structure of the flexible display device in the fabrication process, while FIG. 2 is a cross-sectional view illustrating the package structure of the flexible display device along a cross-sectional line 2-2' in FIG. 1D. As shown in FIGS. 1A-1D and FIG. 2, the package structure of the flexible display device 10 of the present embodiment includes a flexible opto-electronic display panel 20, a first barrier layer 30 and a second barrier layer 40. The flexible opto-electronic display panel 20 includes a backplane (or namely back-plate) 22, a flexible frontplane (or namely front-plate) 24, an array layer 28 (not shown in FIGS. 1A-1D), and a display media layer 26 (not shown in FIGS. 1A-1D). The backplane 22 includes a first surface 221 and a second surface 222, and a display region 22D and at least one bonding region 22C are defined in the first surface 221. The backplane 22 further includes connecting wires (not shown) formed thereon to electrically connect the array layer 28 to the bonding region 22C. The flexible frontplane 24 faces the first surface 221 of the backplane 22. The flexible frontplane 24 includes a first surface 241 and a second surface 242, and the second surface 242 of the flexible frontplane 24 faces the first surface 221 of the backplane 22. The flexible frontplane 24 is substantially corresponding to the display region 22D of the backplane 22, but is not limited thereto. In this embodiment, the material of the backplane 22 is preferably flexible, but not limited thereto. For example, the material of the backplane 22 may also be rigid. The array layer 28 is disposed in the display region 22D of the backplane 22, and substantially corresponding to the display region 22D for driving the display media layer 26. The array layer 28 may include gate lines, data lines, active switching elements, pixel electrodes and pixel regions (not shown) corresponding to the pixel regions P of the display media layer 26, so as to actively drive the display media layer 26. In each of the pixel regions P, at least one active switching element is disposed, but not limited thereto. For instance, the array layer 28 may include a plurality of stripe electrodes arranged intersectedly to passively drive the display media layer 26. The display media layer 26 is disposed between the flexible frontplane 24 and the backplane 22, e.g. between the array layer 28 and the flexible frontplane 24, but not limited thereto. The display media layer 26 is substantially corresponding to the display region 22D of the backplane 22, and at least one side of the display media layer 26 aligns with the backplane 22. Specifically, when the bonding region 22C of the backplane 22 is exposed, one side of the display media layer 26 may substantially align with the corresponding side of the backplane 22, or two sides of the display media layer 26 may substantially align with two corresponding sides of the backplane 22, or three sides of the display media layer 26 may substantially align with three corresponding sides of the backplane 22. It is to be understood that in the descriptions of the specification, the term "align with" means that the corresponding sides of two layers align with each other in a vertical direction, and a certain margin of error can be tolerated. For instance, an error within several millimeters (mm) can be acceptable.

The first barrier layer 30 is disposed on the first surface 241 of the flexible frontplane 24 in order to provide adequate buffering and protecting effects for the flexible frontplane 24. The flexible frontplane 24, the display media layer 26, the array layer 28 and the first barrier layer 30 all expose the bonding region 22C of the backplane 22. The second barrier layer 40 is disposed on the second surface 222 of the backplane 22 in order to provide adequate buffering and protecting effects for the backplane 22. Furthermore, the package structure of the flexible display device 10 further includes an IC driver 12, and at least one flexible printed circuit board 14 bonded to the bonding region 22C of the backplane 22, and a protection glue 16 (not shown in FIG. 2) covering the bonding region 22C exposed by the flexible frontplane 24, the display media layer 26, the array layer 28 and the first barrier layer 30 to protect the IC driver 12 and the flexible printed circuit board 14.

In this embodiment, at least one side of the first barrier layer 30 protrudes the flexible frontplane 24. To be exact, when the bonding region 22C of the backplane 22 is exposed, one side of the first barrier layer 30 may protrude from one corresponding side of the flexible frontplane 24, or two sides of the first barrier layer 30 may protrude from two corresponding sides of the flexible frontplane 24, or three sides of the first barrier layer 30 may protrude from three corresponding sides of the flexible frontplane 24. Also, at least one side of the second barrier layer 40 protrudes from the backplane 22. Specifically, one side of the second barrier layer 40 may protrude from one corresponding side of the backplane 22, or two sides of the second barrier layer 40 may protrude from two corresponding sides of the backplane 22, or three sides of the second barrier layer 40 may protrude from three corresponding sides of the backplane 22, or four sides of the second barrier layer 40 may all protrude from four corresponding sides of the backplane 22. In addition, at least one side of the second barrier layer 40 protrudes from the first barrier layer 30, e.g. one side of the second barrier layer 40 protrudes from one corresponding side of the first barrier layer 30, or two sides of the second barrier layer 40 protrudes from two corresponding sides of the first barrier layer 30, or three sides of the second barrier layer 40 protrudes from three corresponding sides of the first barrier layer 30, or four sides of the second barrier layer 40 protrudes from four corresponding sides of the first barrier layer 30.

The package structure of the flexible display device 10 in this embodiment further includes an encapsulation layer 18 disposed between the first barrier layer 30 and the second barrier layer 40, and disposed outside the flexible frontplane 24 and the backplane 22. To be exact, the encapsulation layer 18 is disposed in the space formed by the at least one side of the first barrier layer 30 protruding from the backplane 22 and the at least one side of the second barrier layer 40 protruding from the backplane 22. The encapsulation layer 18 also surrounds the edges of the flexible frontplane 24 and the backplane 22. Accordingly, the encapsulation layer 18 is able to adhere the first barrier layer 30 and the second barrier layer 40 together, and is able to isolate the flexible frontplane 24 and the backplane 22 from water vapor. Furthermore, the encapsulation layer 18 may further surround the bonding region 22C of the backplane 22 to enhance the protection for the package structure of the flexible display device 10. It is to be noted that to enhance the structural strength of the package structure of the flexible display device 10, particularly when the material of the backplane 22 is flexible, the second barrier layer 40 may be optionally bonded to a rigid substrate 1, i.e. the second barrier layer 40 is disposed between the rigid substrate 1 and the second surface 222 of the backplane 22.

The package structure of the flexible display device of the present invention is not limited to the aforementioned embodiment. Other embodiments or variants will be illustrated in the following passages. To simplify the illustration and to highlight the differences between different embodiments, same components will be denoted by same numerals, and will not be redundantly described.

Figure 3:
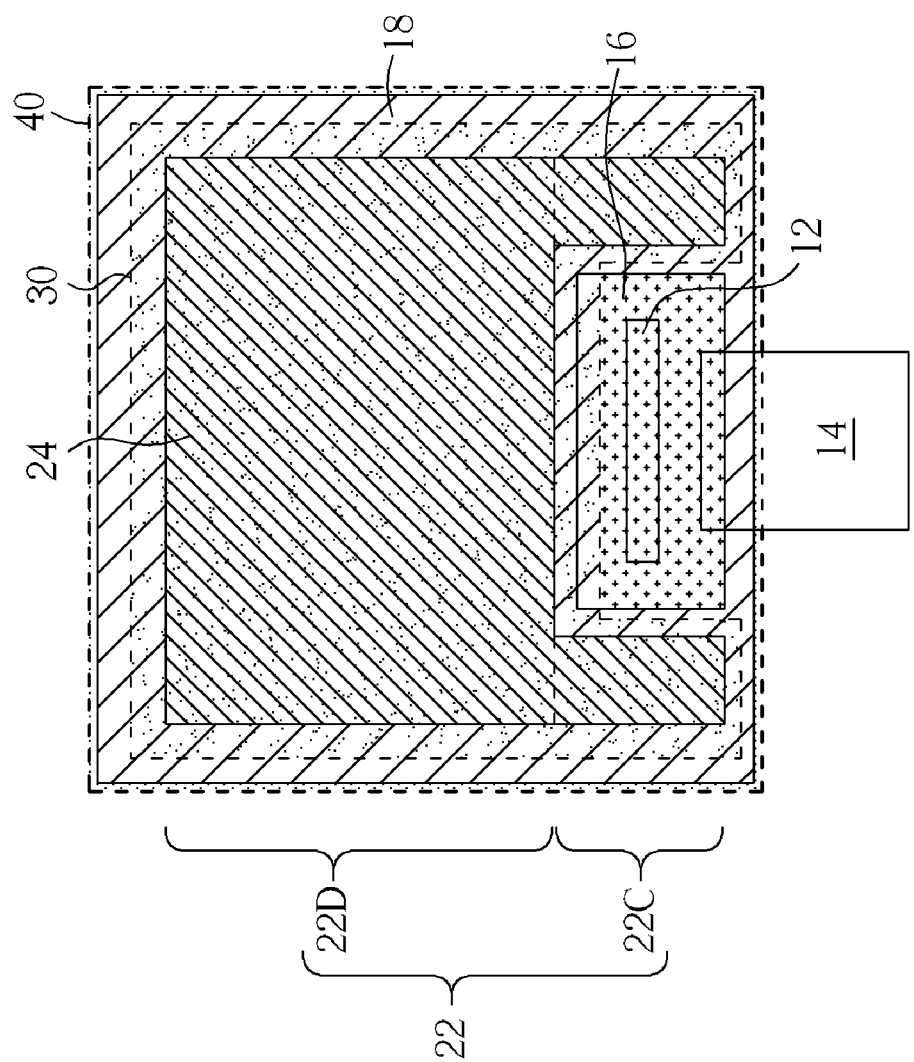
FIG. 3 is a schematic diagram illustrating a package structure of a flexible display device according to a variant of the first embodiment of the present invention.

Please refer to FIG. 3, as well as FIG. 2. FIG. 3 is a schematic diagram illustrating a package structure of a flexible display device according to a variant of the first embodiment of the present invention. As shown in FIG. 3, in this variant of the first embodiment, the flexible frontplane (or namely front-plate) 24 further extends to two opposite sides of the IC driver 12 and the flexible printed circuit board 14. The display media layer 26 and the array layer 28 may extend as well as the flexible frontplane 24 to increase display area or to simply provide other effect based on other considerations. For instance, the extension of the flexible frontplane 24 and/or the display media layer 26 and the array layer 28 may enhance the structural strength of the backplane (or namely back-plate) 22 at these corner regions.

Figure 4:
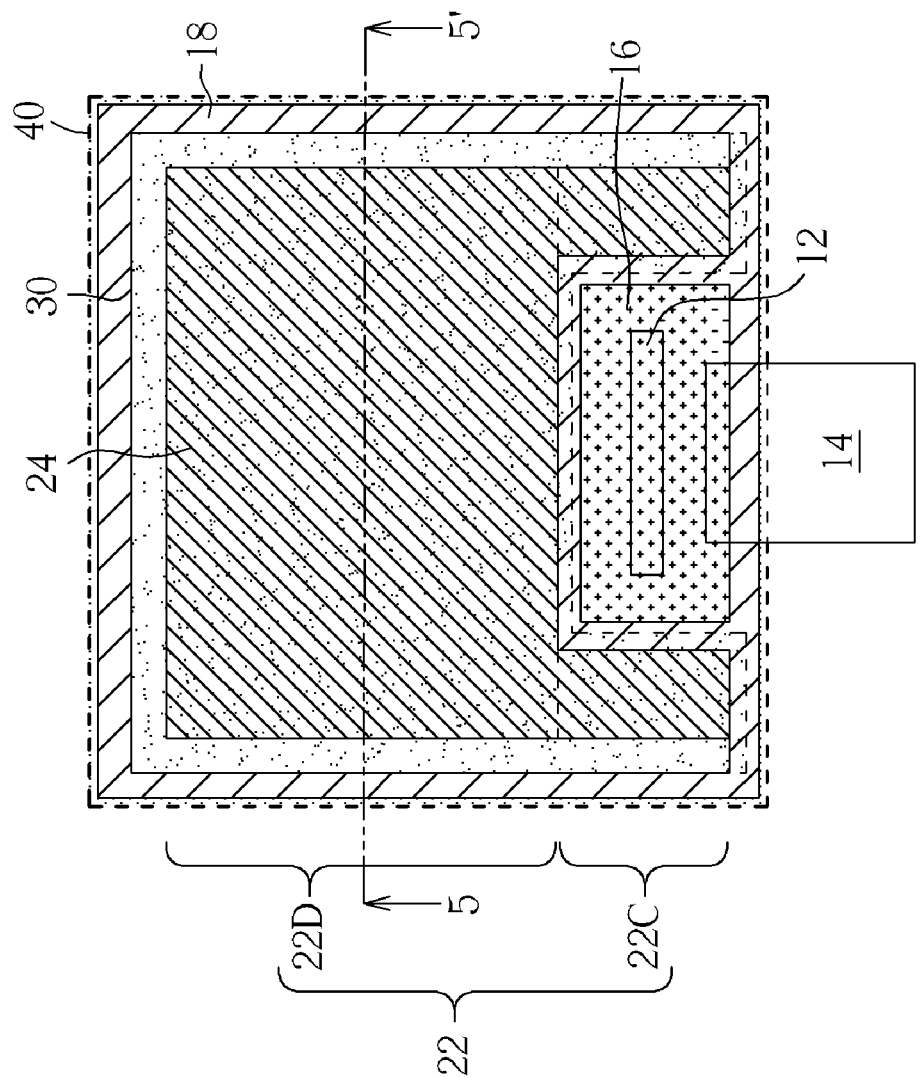
FIGS. 4-5 are schematic diagrams illustrating a package structure of a flexible display device according to a second preferred embodiment of the present invention.
Figure 5:
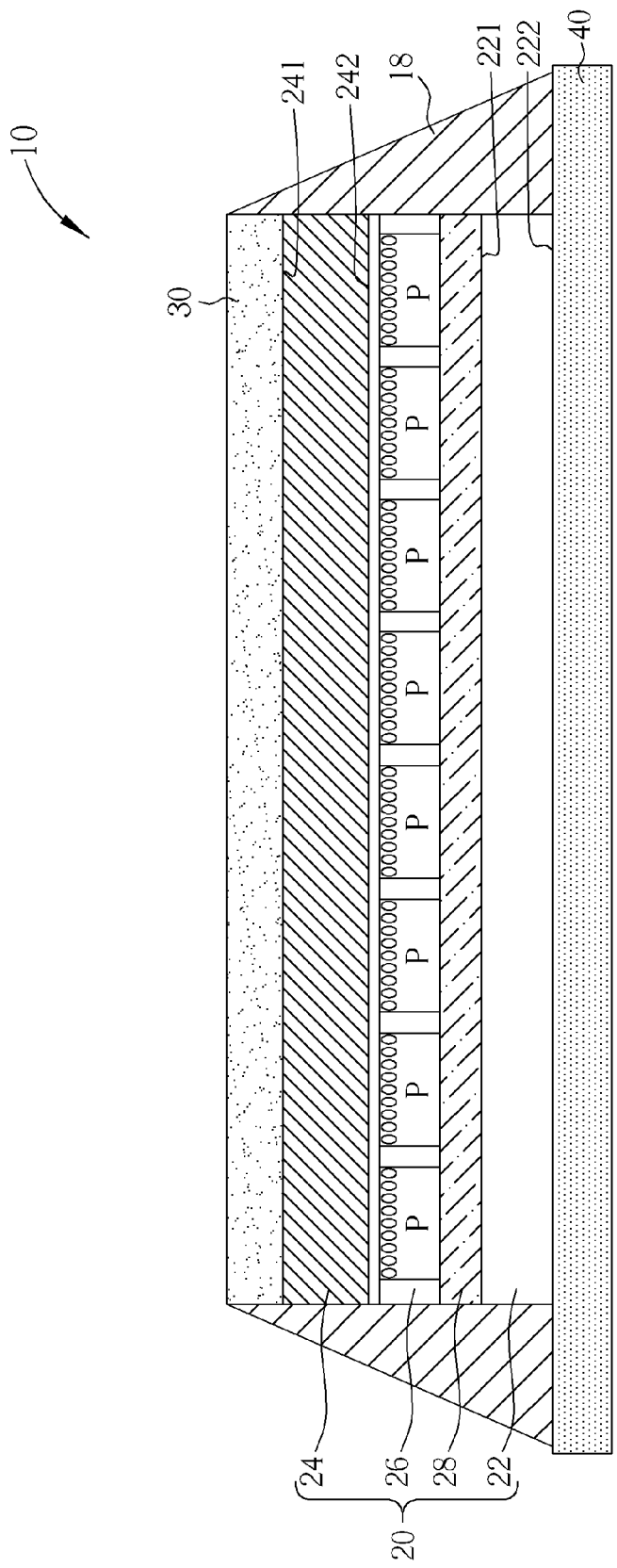

Please refer to FIGS. 4-5. FIGS. 4-5 are schematic diagrams illustrating a package structure of a flexible display device according to a second preferred embodiment of the present invention, where FIG. 4 is a top-view of the package structure of the flexible display device, and FIG. 5 is a cross-sectional view of the package structure of the flexible display device of FIG. 4 along a cross-sectional line 5-5'. As shown in FIGS. 4-5, in this embodiment, both the first barrier layer 30 and the flexible frontplane (or namely front-plate) 24 expose the bonding region 22C of the backplane (or namely back-plate) 22, and no sides of the barrier layer 30 protrude from the flexible frontplane 24. Specifically, the first barrier layer 30 is substantially completely corresponding to the flexible frontplane 24. In addition, the encapsulation layer 18 is disposed on the at least one side of the second barrier layer 40 that protrudes from the backplane 22, and surrounds the edges of the backplane 22, the flexible frontplane 24, the display media layer 26, the array layer 28 and the first barrier layer 30 such that the encapsulation layer 18 is able to isolate the backplane 22, the flexible frontplane 24, the display media layer 26 and the array layer 28 from water vapor. Also, the encapsulation layer 18 may further surround the bonding region 22C of the backplane 22 to enhance the protection for the package structure of the flexible display device 10.

Figure 6:
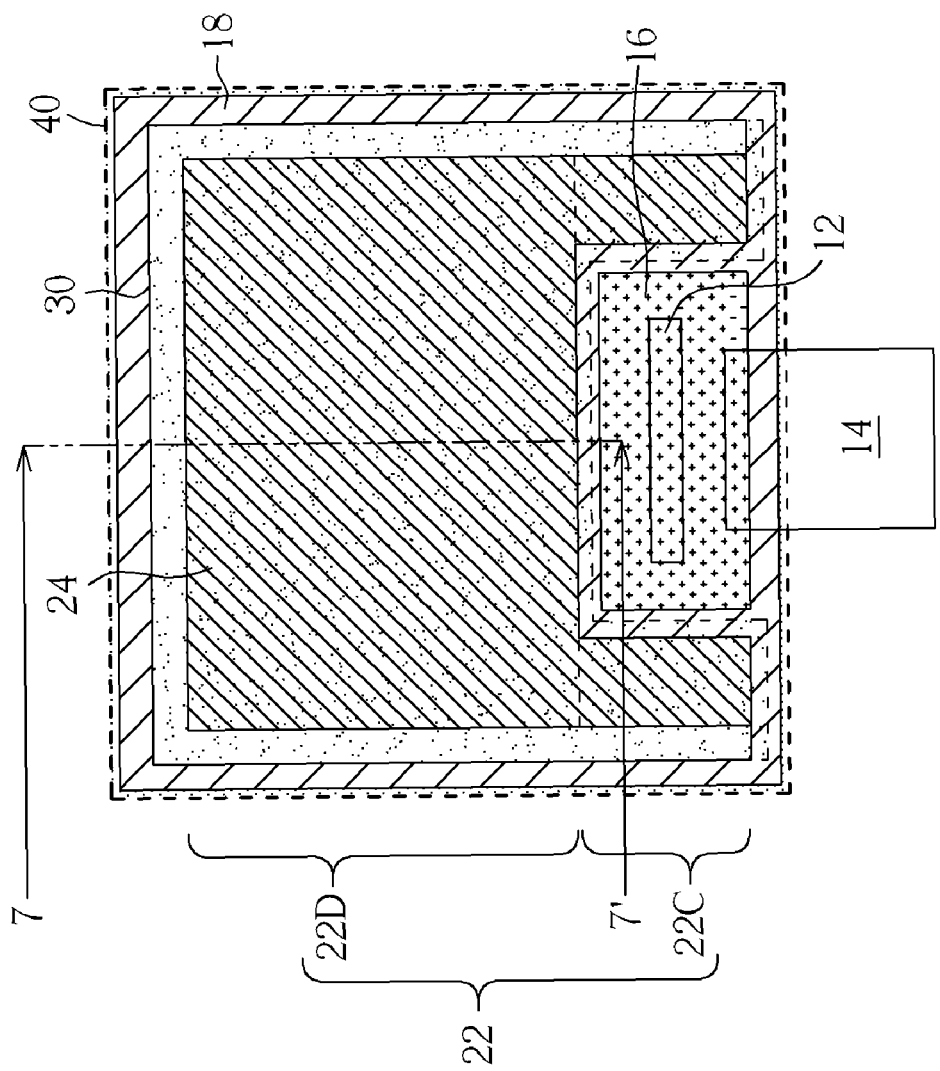
FIGS. 6-7 are schematic diagrams illustrating a package structure of a flexible display device according to a third preferred embodiment of the present invention.
Figure 7:
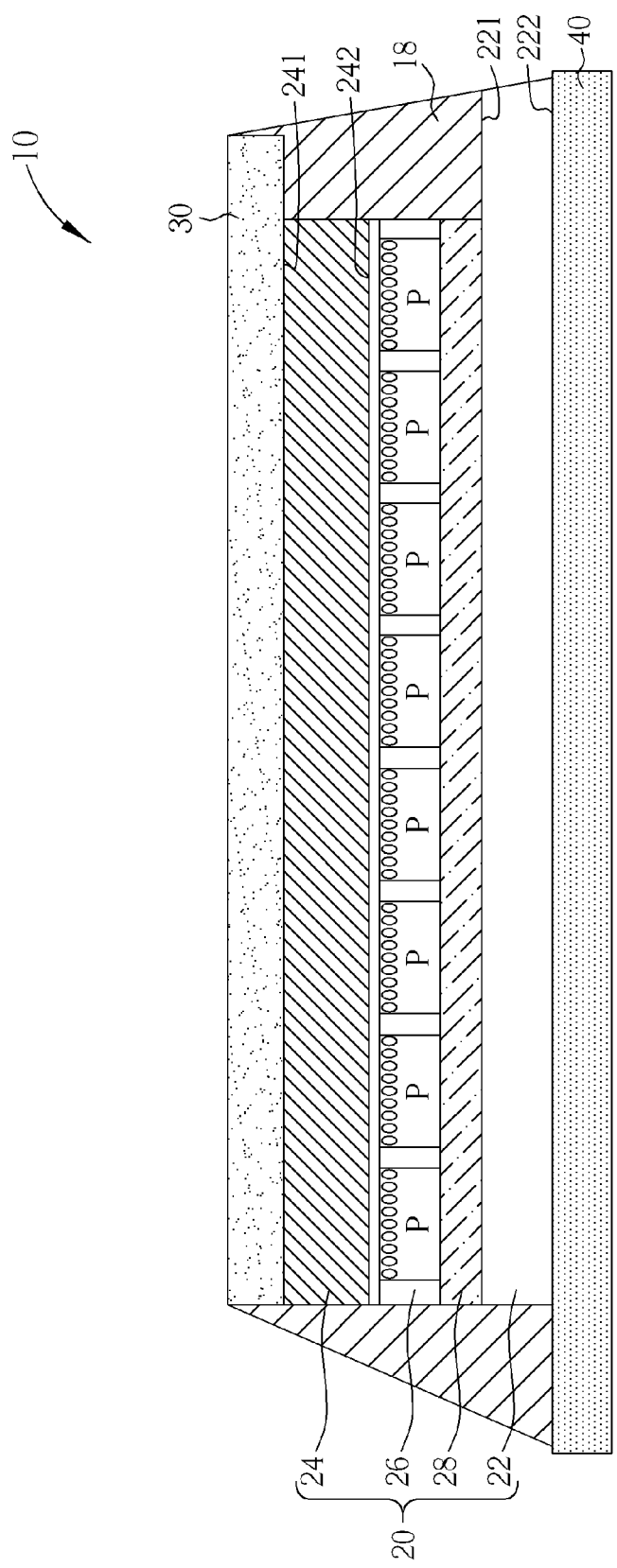

Please refer to FIGS. 6-7. FIGS. 6-7 are schematic diagrams illustrating a package structure of a flexible display device according to a third preferred embodiment of the present invention, where FIG. 6 is a top-view of the package structure of the flexible display device, and FIG. 7 is a cross-sectional view of the package structure of the flexible display device of FIG. 6 along a cross-sectional line 7-7'. As shown in FIGS. 6-7, in this embodiment, both the first barrier layer 30 and the flexible frontplane (or namely front-plate) 24 expose the bonding region 22C of the backplane 22, and the side of the first barrier layer 30 that is adjacent to the bonding region 22C protrudes from the flexible frontplane 24. In addition, the encapsulation layer 18 is disposed on the at least one side of the second barrier layer 40 that protrudes from the backplane (or namely back-plate) 22. In the periphery of the bonding region 22C, the encapsulation layer 18 is disposed between the first barrier layer 30 and the backplane 22, and surrounds the edges of the flexible frontplane 24, the display media layer 26, the array layer 28 and the first barrier layer 30. In the exterior of the display region 22D and the bonding region 22C, the encapsulation layer 18 is disposed on the at least one side of the second barrier layer 40 that protrudes from the backplane 22, and surrounds the edges of the backplane 22, the flexible frontplane 24, the display media layer 26, the array layer 28 and the first barrier layer 30. Accordingly, the encapsulation layer 18 is able to isolate the backplane 22, the flexible frontplane 24, the display media layer 26, and the array layer 28 from water vapor. Also, the encapsulation layer 18 may further surround the bonding region 22C of the backplane 22 to enhance the protection for the package structure of the flexible display device 10.

Figure 8:
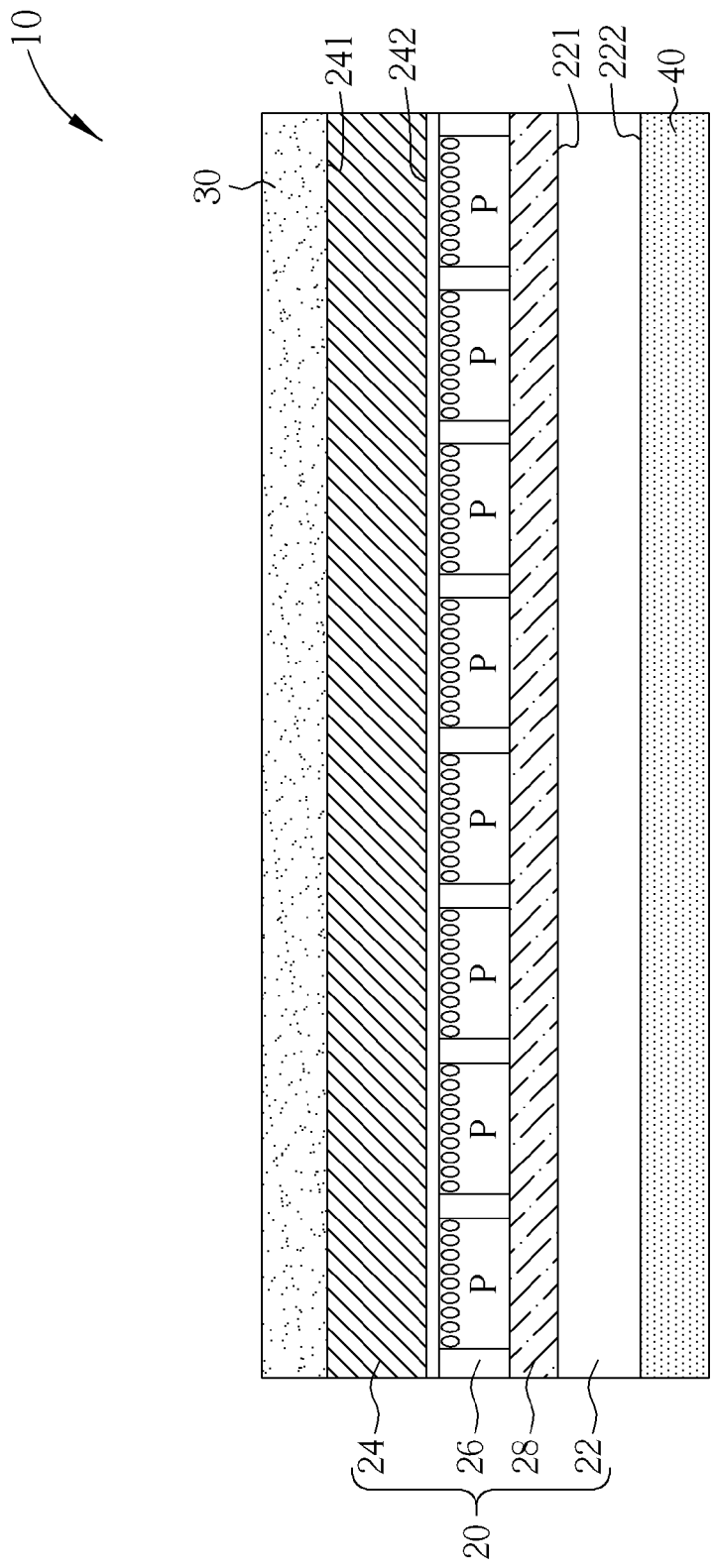
FIG. 8 is a schematic diagram illustrating a package structure of a flexible display device according to a fourth preferred embodiment of the present invention.

Please refer to FIG. 8. FIG. 8 is a schematic diagram illustrating a package structure of a flexible display device according to a fourth preferred embodiment of the present invention. As shown in FIG. 8, in order to meet some particular product specification, e.g. narrow frame design, the package structure of the flexible display device 10 in this embodiment may not dispose encapsulation layer. In such a case, the first barrier layer 30 can be substantially completely corresponding to the flexible frontplane (or namely front-plate) 24, and the second barrier layer 40 can be substantially corresponding to the backplane (or namely back-plate) 22.

Figure 9:
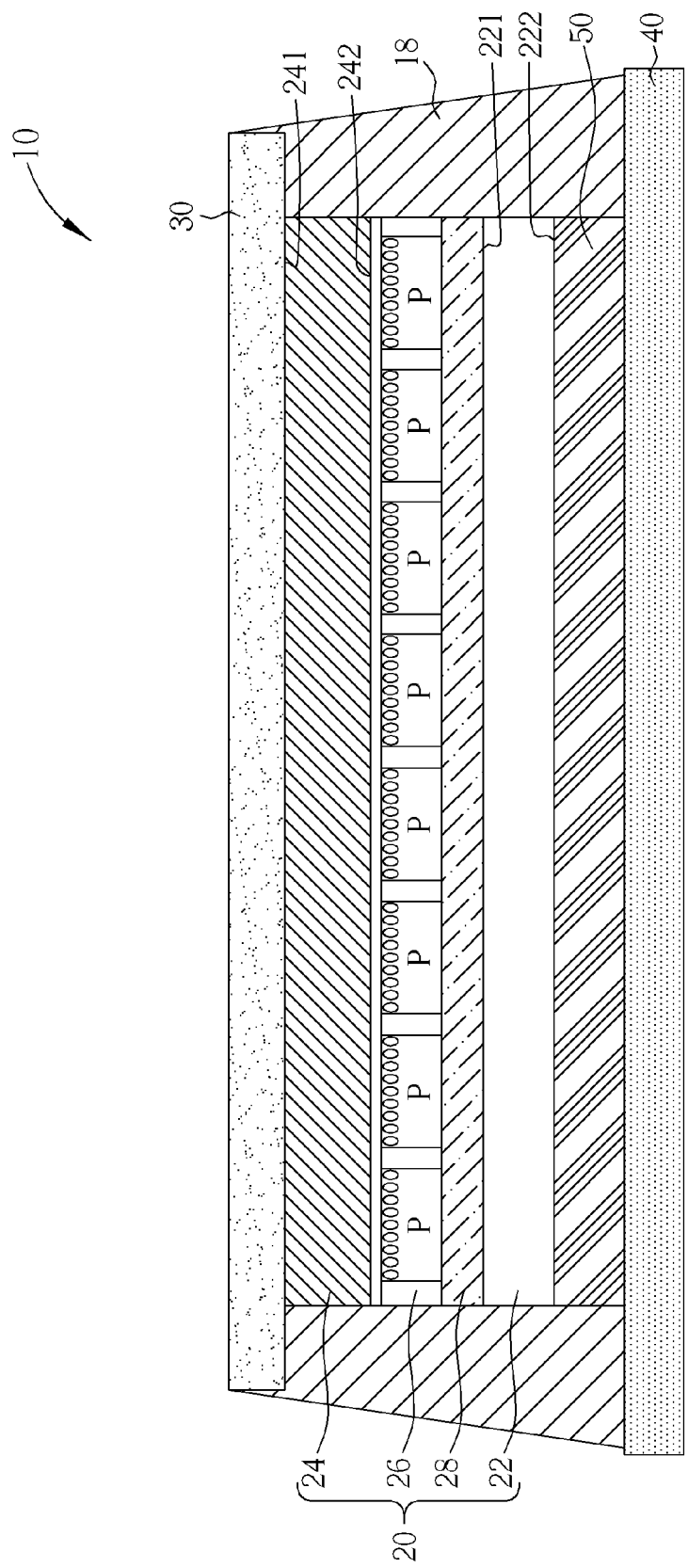
FIG. 9 is a schematic diagram illustrating a package structure of a flexible display device according to a fifth preferred embodiment of the present invention.

Please refer to FIG. 9. FIG. 9 is a schematic diagram illustrating a package structure of a flexible display device according to a fifth preferred embodiment of the present invention. As shown in FIG. 9, the package structure of the flexible display device 10 in this embodiment further includes a bottom protection layer 50 disposed between the second barrier layer 40 and the second surface 222 of the backplane (or namely back-plate) 22. The bottom protection layer 50 is able to provide buffering effect to prevent the flatness of the second barrier layer 40 from being damaged due to unexpected particles or bubbles generated in the fabrication of the package structure of the flexible display device 10. In other words, the bottom protection layer 50 ensures the flatness of the second barrier layer 40, and thus the quality of the array layer 28 and the display media layer 26 as well as the display quality of the flexible opto-electronic display panel 20 can be guaranteed.

Figure 10:
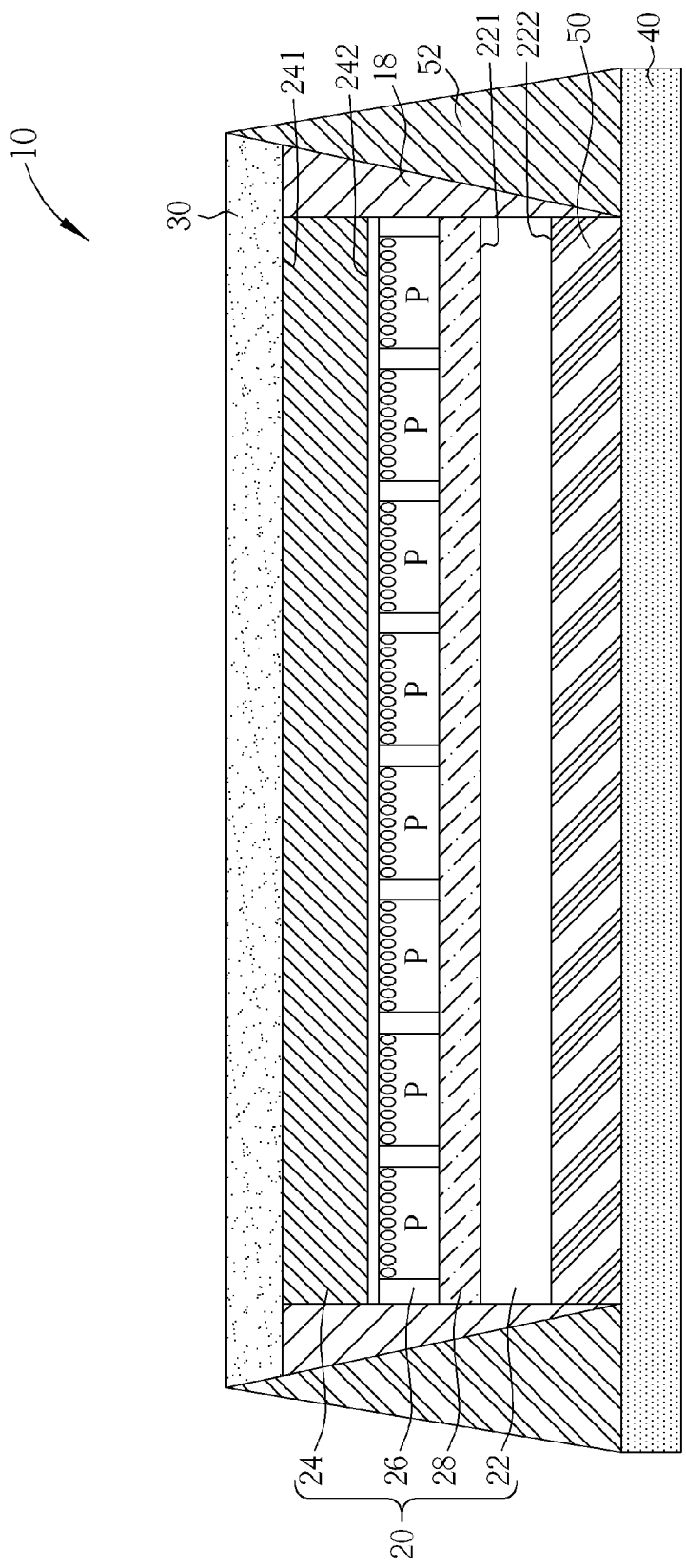
FIG. 10 is a schematic diagram illustrating a package structure of a flexible display device according to a variant of the fifth embodiment of the present invention.

Please refer to FIG. 10. FIG. 10 is a schematic diagram illustrating a package structure of a flexible display device according to a variant of the fifth embodiment of the present invention. As shown in FIG. 10, the package structure of the flexible display device 10 in this variant further includes an enhancement encapsulation layer 52 surrounding the encapsulation layer 18. By virtue of this dual-layered encapsulation design, the package structure of the flexible display device 10 can be better secured.

Figure 11A:
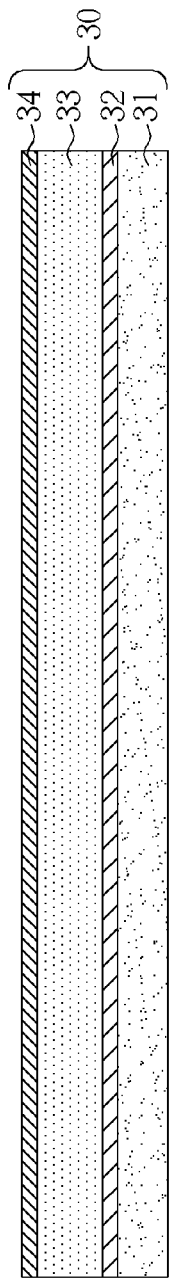
FIGS. 11A-11G are schematic diagrams respectively illustrating a first barrier layer according to eight different configurations.

Please refer to FIGS. 11A-11G. FIGS. 11A-11G are schematic diagrams respectively illustrating a first barrier layer according to eight different configurations. In these eight configurations, the first barrier layer is a composite barrier layer, but not limited thereto. The composite barrier layer possesses better protection effect and isolation effect against water vapor. FIG. 11A depicts a first barrier layer 30 including an adhesive layer 31, a barrier film 32, an organic substrate 33 and an exterior film 34 disposed in sequence.

Figure 11B:
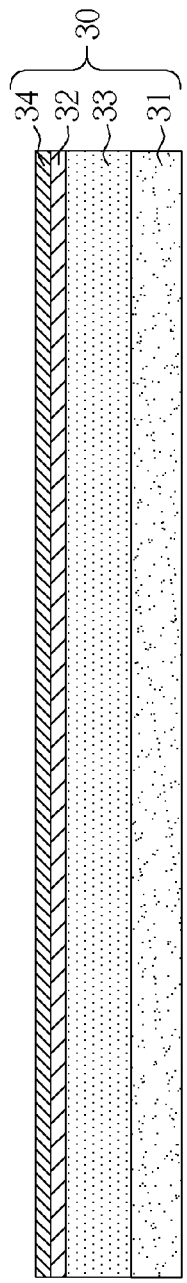

FIG. 11B depicts a first barrier layer 30 including an adhesive layer 31, an organic substrate 33, a barrier film 32 and an exterior film 34 disposed in sequence.

Figure 11C:
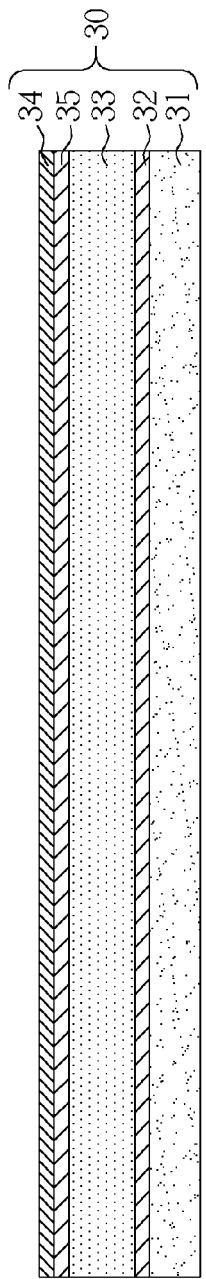

FIG. 11C depicts a first barrier layer 30 including an adhesive layer 31, a barrier film 32 an organic substrate 33, another barrier film 35 and an exterior film 34 disposed in sequence.

Figure 11D:
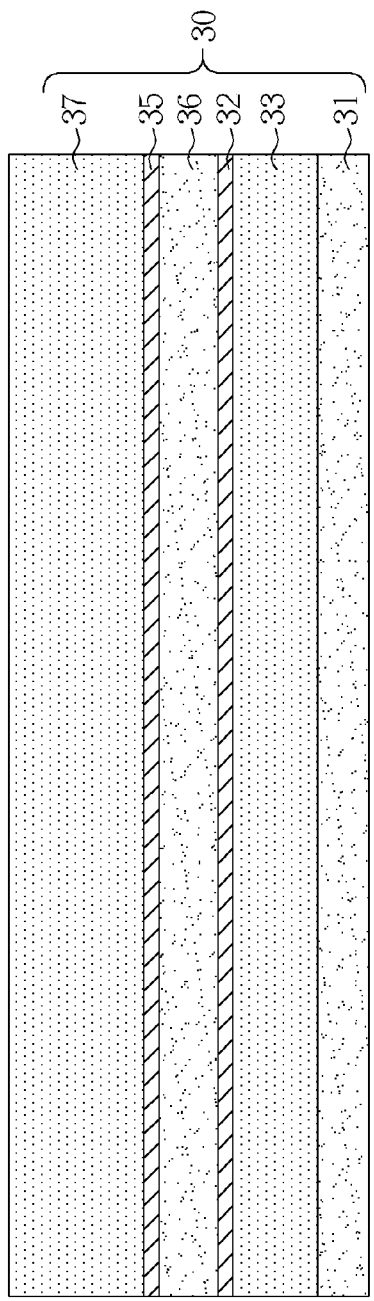

FIG. 11D depicts a first barrier layer 30 including an adhesive layer 31, an organic substrate 33, a barrier film 32, another adhesive layer 36, another barrier film 35 and another organic substrate 37 disposed in sequence.

Figure 11E:
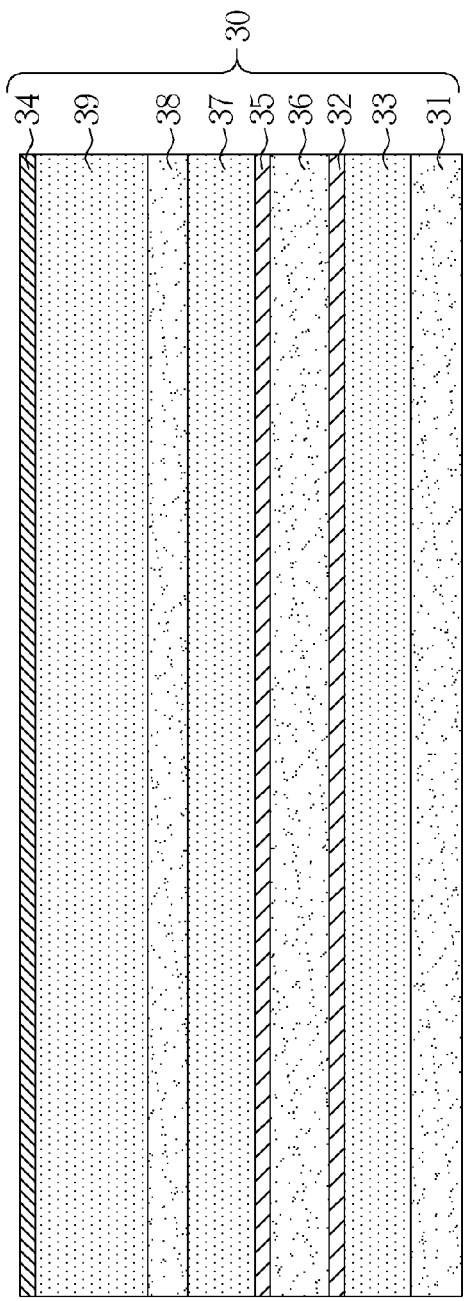

FIG. 11E depicts a first barrier layer 30 including an adhesive layer 31, an organic substrate 33, a barrier film 32, another adhesive layer 36, another barrier film 35, another organic substrate 37, another adhesive layer 38, another organic substrate 39 and an exterior film 34 in sequence.

Figure 11F:
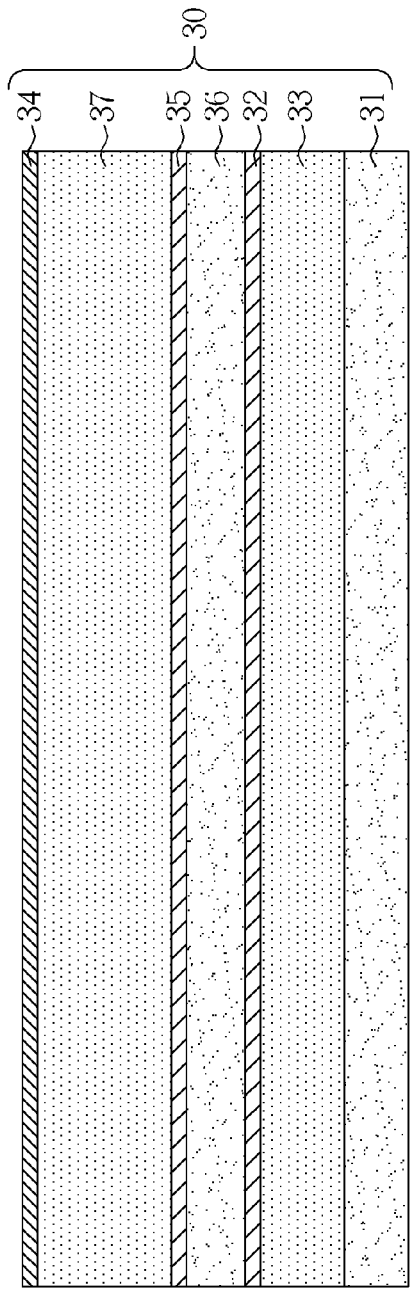

FIG. 11F depicts a first barrier layer 30 including an adhesive layer 31, an organic substrate 33, a barrier film 32, another adhesive layer 36, another barrier film 35, another organic substrate 37 and an exterior film 34.

Figure 11G:
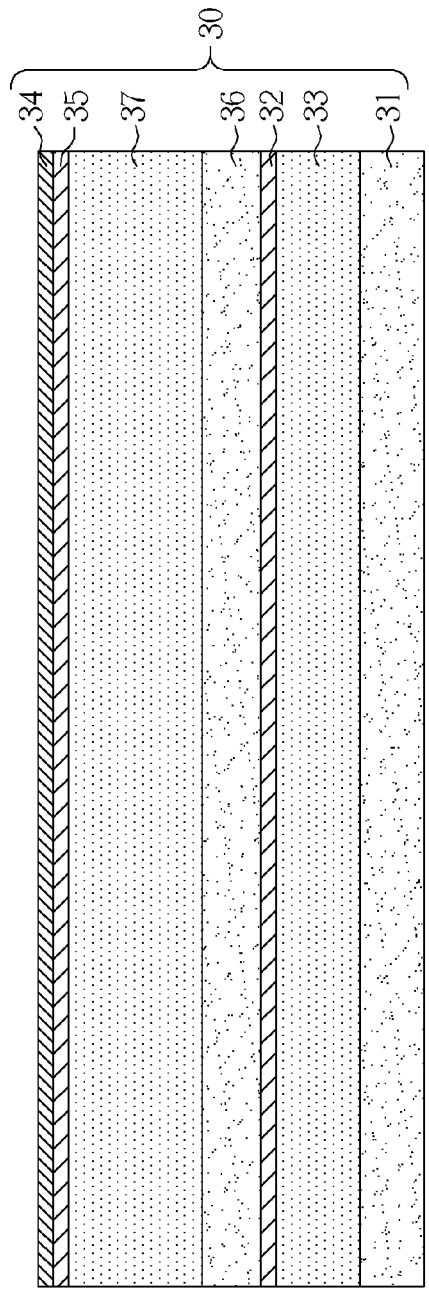

FIG. 11G depicts a first barrier layer 30 including an adhesive layer 31, an organic substrate 33, a barrier film 32, another adhesive layer 36, another organic substrate 37, another barrier film 35 and an exterior film 34.

In the above configurations of the first barrier layer 30, the adhesive layer 31 is configured to adhere the first barrier layer 30 to the first surface of the flexible frontplane; the adhesive layers 36, 38 are configured to adhere adjacent organic substrates 33, 37, 39 or barrier films 32, 35 together; and the exterior film 34 at least has one of the following effects including anti-glare, anti-reflection, anti-smudge and anti-wear. Each of the barrier films 32, 35 may be an inorganic film such as a silicon oxide film or an aluminum oxide film, and in such case the thickness of the barrier film 32 or 35 may be between 0.1 micrometers and 0.6 micrometers, but not limited thereto. Each of the barrier films 32, 35 may also be a composite layer of inorganic film and organic film overlapping to each other, and in such case the thickness of the barrier film 32 or 35 is preferably less than 2 micrometers, but not limited thereto. In addition, the materials of the adhesive layers 31, 36, 38 and the exterior film 34 are preferably organic materials. The thickness of the organic substrate 33, 37 or 39 is preferably larger than 12 micrometers, but not limited thereto. The organic substrates 33, 37, 39 may have different thicknesses. The thickness of the adhesive layer 31, 36 or 38 is preferably about 20 micrometers, but not limited thereto. The adhesive layers 31, 36, 38 may have different thicknesses. The thickness of the exterior film 34 is preferably between 3 micrometers and 5 micrometers, but not limited thereto. Since the barrier films 32, 35 may be inorganic films, the barrier films 32, 35, the organic substrates 33, 37, 39 and the adhesive layers 31, 36, 38 may form an overlapping structure of inorganic materials and organic materials. The inorganic/organic overlapping structure is able to increase the flexibility of the first barrier layer 30, thereby reducing the risk of cracking. Furthermore, the first barrier layer 30 is disposed on the display plane of the flexible opto-electronic display panel 20, and the material of each film of the first barrier layer 30 is preferably selected from highly transparent materials.

Figure 12A:
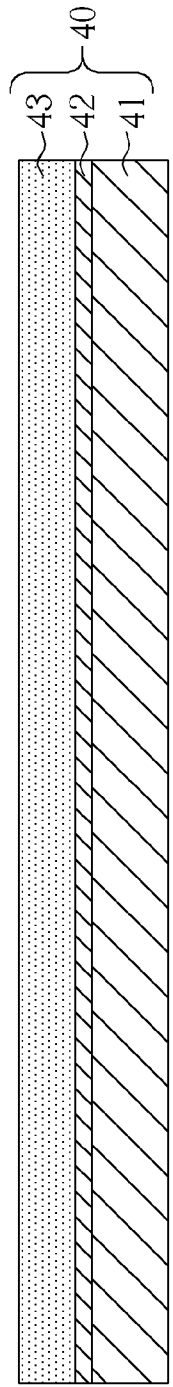
FIGS. 12A-12C are schematic diagrams respectively illustrating a second barrier layer according to three different configurations.
Figure 12B:
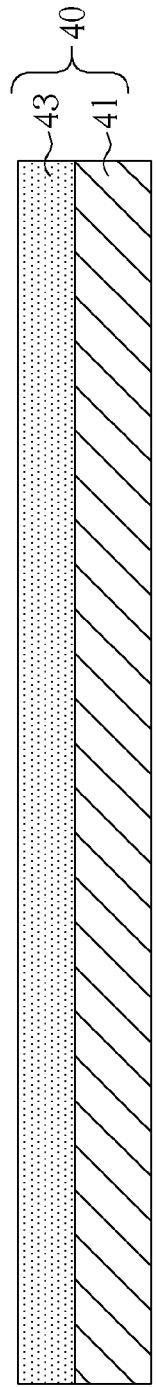
Figure 12C:
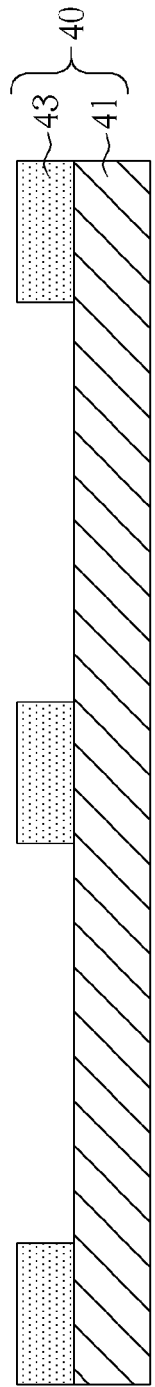

Please refer to FIGS. 12A-12C. FIGS. 12A-12C are schematic diagrams respectively illustrating a second barrier layer according to three different configurations. In these three configurations, the second barrier layer is a composite barrier layer, but not limited thereto. The composite barrier layer possesses better protection effect and isolation effect against water vapor. FIG. 12A depicts a second barrier layer 40 including an organic substrate 41, a barrier film 42 and an adhesive layer 43 disposed in sequence. The barrier film 42 may be an inorganic film such as a silicon oxide film or an aluminum oxide film, and in such case the thickness of the barrier film 42 may be between 0.1 micrometers and 0.6 micrometers, but not limited thereto. The adhesive layer 43 is used to adhere the second barrier layer 40 to the second surface of the backplane. The material of the adhesive layer 43 is preferably selected from organic materials, such that the adhesive layer 43, the barrier film 42 and the organic substrate 41 may form an overlapping structure of inorganic materials and organic materials. The inorganic/organic overlapping structure is able to increase the flexibility of the second barrier layer 40, thereby reducing the risk of cracking. In addition, the barrier film 42 may also be formed by overlapping inorganic film and organic film, and in such case the thickness of the barrier film 42 is preferably less than 2 micrometers, but not limited thereto.

FIG. 12B depicts a second barrier layer 40 including an organic substrate 41 and an adhesive layer 43 disposed in sequence. The thickness of the organic substrate 41 is preferably larger than 0.3 micrometers.

FIG. 12C depicts a second barrier layer 40 including an organic substrate 41 and an adhesive layer 43 disposed in sequence. The thickness of the organic substrate 41 is preferably larger than 0.3 micrometers. Also, different from the above configuration, the adhesive layer 43 in this configuration is a patterned adhesive layer.

Figure 13:
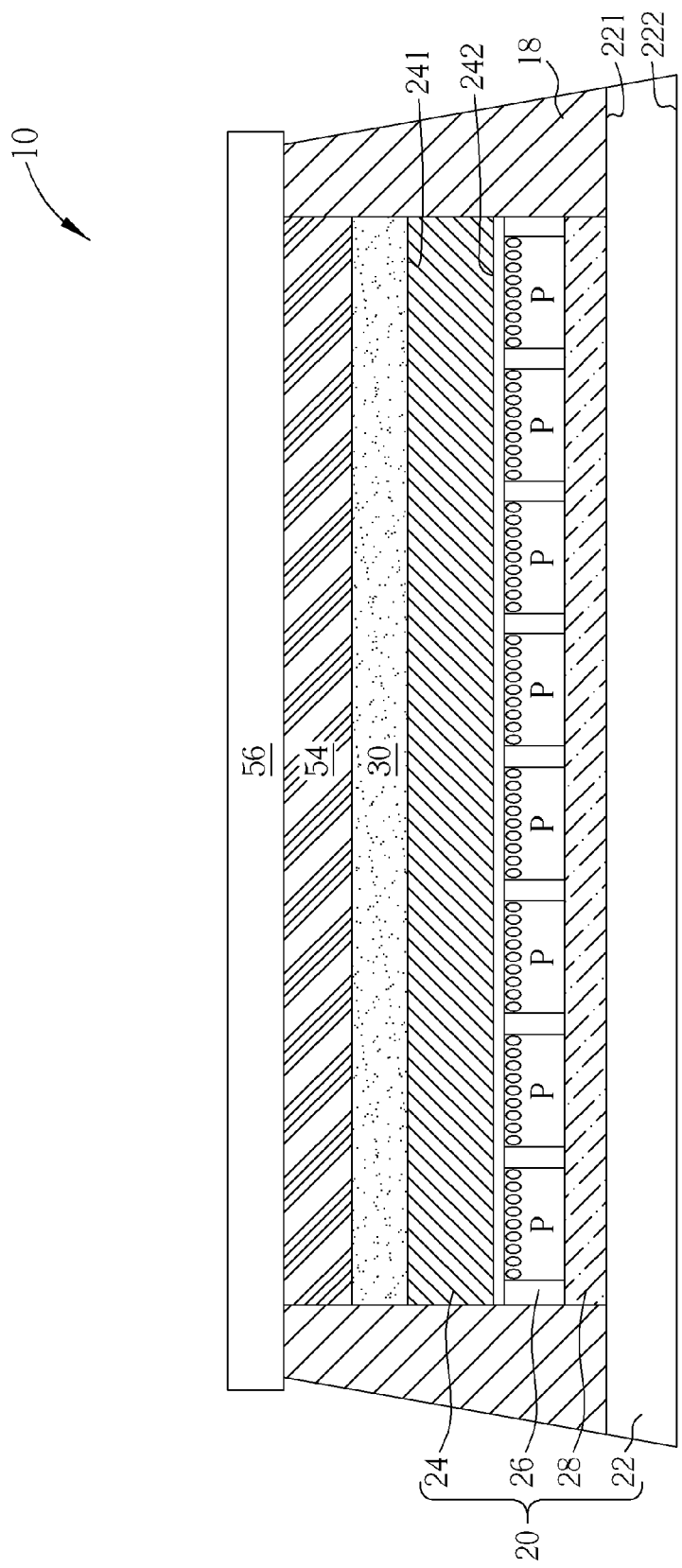
FIG. 13 is a schematic diagram illustrating a package structure of a flexible display device according to a sixth preferred embodiment of the present invention.

Please refer to FIG. 13. FIG. 13 is a schematic diagram illustrating a package structure of a flexible display device according to a sixth preferred embodiment of the present invention. As shown in FIG. 13, the first barrier layer 30 is disposed on the flexible frontplane (or namely front-plate) 24 of the package structure of the flexible display device 10, and a top protection layer 54 and an exterior film 56 are further disposed on the first barrier layer 30. A second barrier layer may not be required to be disposed on the second surface 222 of the backplane (or namely back-plate) 22. The first barrier layer 30 is able to provide buffering and protection effects for the flexible frontplane 24. The first barrier layer 30 may be any structures disclosed in the aforementioned configurations, but not limited thereto. The first barrier layer 30 may be bonded to the first surface 241 of the flexible frontplane 24 by any types of bonding methods such as direct bonding or by adhesives. In addition, the top protection layer 54 may be bonded to the first barrier layer 30 by direct bonding or by adhesives to provide enhanced protection. The exterior film 56 may be bonded to the top protection layer 54 by direct bonding or by adhesives to provide one or more effects including anti-glare, anti-reflection, anti-smudge and anti-wear. In this embodiment, at least one side of the first barrier layer 30 and at least one side of the top protection layer 54 substantially align with the display media layer 26, and at least one side of the exterior film 56 protrudes from the top protection layer 54. Also, the encapsulation layer 18 is disposed between the exterior film 56 and the backplane 22, and surrounds the edges of the top protection layer 54, the first barrier layer 30, the flexible frontplane 24 and the display media layer 26.

Figure 14:
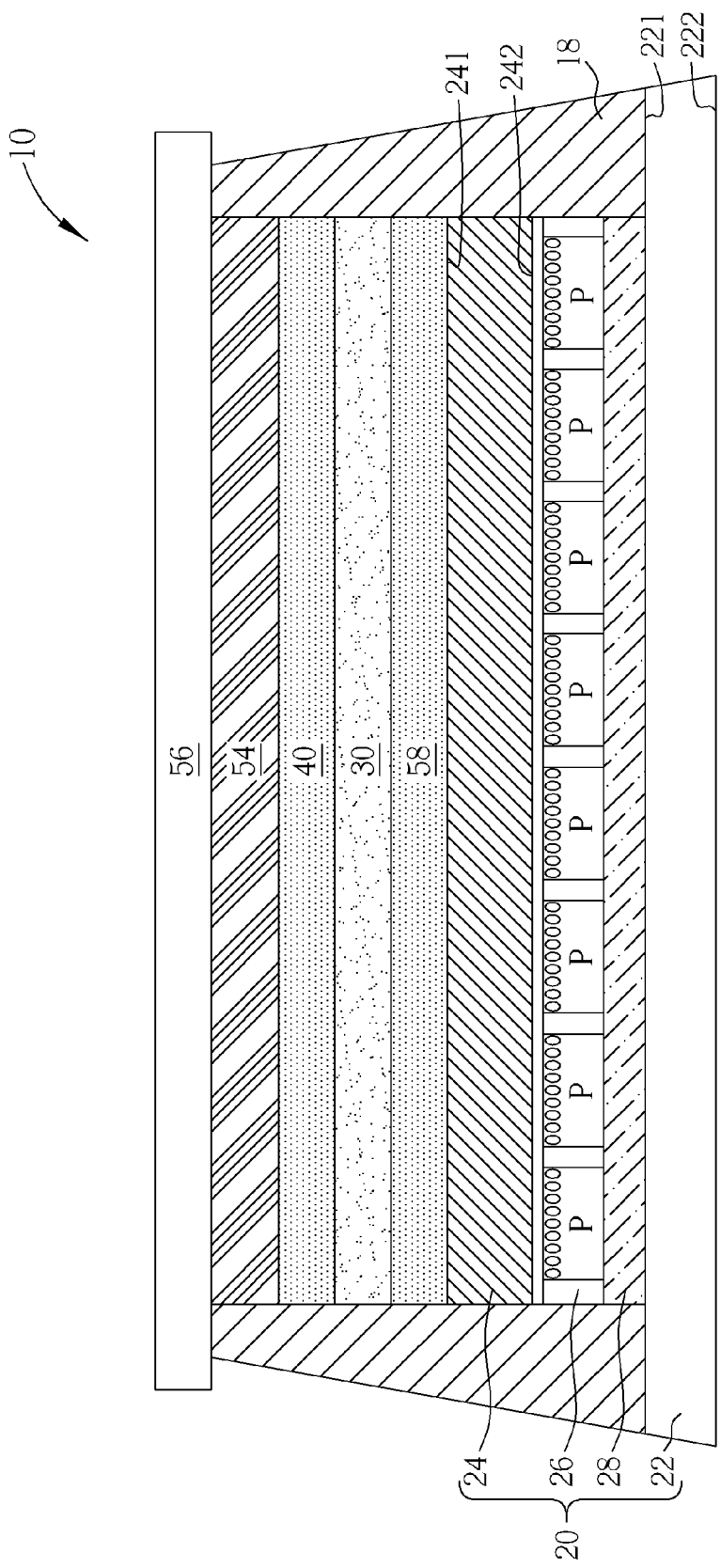
FIG. 14 is a schematic diagram illustrating a package structure of a flexible display device according to a seventh preferred embodiment of the present invention.

Please refer to FIG. 14. FIG. 14 is a schematic diagram illustrating a package structure of a flexible display device according to a seventh preferred embodiment of the present invention. As shown in FIG. 14, different from the sixth embodiment, the package structure of the flexible display device 10 in this embodiment further includes a second barrier layer 40 disposed between the first barrier layer 30 and the top protection layer 54. At least one side of the second barrier layer 40 substantially aligns with one corresponding side of the first barrier layer 30. The second barrier layer 40 may be any structures disclosed in the aforementioned configurations, but not limited thereto. The second barrier layer 40 may be bonded to the first barrier layer 30 by any types of bonding methods such as direct bonding or by adhesives. In addition, the package structure of the flexible display device 10 may further include a supporting substrate 58 disposed between the flexible frontplane (or namely front-plate) 24 and the first barrier layer 30 to enhance the structural strength of the first barrier layer 30.

In conclusion, the package structure of the flexible display device of the present invention uses a first barrier layer and/or a second barrier layer to provide sufficient protection effect and isolation effect against water vapor. Also, the encapsulation layer, which adheres the first barrier layer to the second barrier layer, also surrounds the edge of the flexible opto-electronic display panel. Consequently, the sealing effect in the lateral side of the flexible opto-electronic display panel can be secured. In addition, the first barrier layer and the second barrier layer may include an overlapping structure of inorganic material and organic material, which can provide excellent flexibility. Accordingly, the flexibility of package structure of the flexible display device will be maintained even when the first barrier layer and the second barrier layer are integrated. The present invention can be applied to package various types of flexible opto-electronic display panels such as electrophoretic display (EPD) panels, OLED panels, cholesteric LCD panels, and electro-chromic display panels, etc, to provide sufficient protection.

Those skilled in the art will readily observe that numerous modifications and alterations of the device and method may be made while retaining the teachings of the invention.

What is claimed is:

1. A package structure of a flexible display device, comprising:
   a flexible opto-electronic display panel, comprising:
      a backplane, comprising a first surface and a second surface, the backplane comprising a display region and at least one bonding region defined on the first surface of the backplane, wherein the display region comprises an array layer;
      a flexible frontplane, facing the first surface of the backplane, wherein the flexible frontplane comprises a first surface and a second surface, and the second surface of the flexible frontplane faces the first surface of the backplane; and
      a display media layer, disposed between the flexible frontplane and the backplane, wherein the display media layer is substantially corresponding to the display region of the backplane, and at least one side of the display media layer aligns with one corresponding side of the backplane;
   a first barrier layer, disposed on the first surface of the flexible frontplane, wherein the flexible frontplane, the display media layer and the first barrier layer expose the bonding region of the backplane; and
   a second barrier layer, disposed on the second surface of the backplane.

2. The package structure of the flexible display device of claim 1, wherein at least one side of the first barrier layer aligns with the flexible frontplane, at least one side of the second barrier layer aligns with the backplane, and at least one side of the second barrier layer aligns with the first barrier layer.

3. The package structure of the flexible display device of claim 1, further comprising an IC driver and a flexible printed circuit board bonded in the bonding region of the backplane, and a protection glue covering the bonding region exposed by the flexible frontplane, the display media layer and the first barrier layer.

4. The package structure of the flexible display device of claim 1, further comprising a rigid substrate disposed on the backplane, and the second barrier layer is disposed between the rigid substrate and the second surface of the backplane, wherein the backplane is flexible.

5. The package structure of the flexible display device of claim 1, wherein the first barrier layer is a composite barrier layer comprising at least one inorganic film and at least an organic substrate overlapping with each other.

6. The package structure of the flexible display device of claim 1, wherein at least one side of the first barrier layer protrudes from the flexible frontplane, at least one side of the second barrier layer protrudes from the backplane, and at least one side of the second barrier layer protrudes from the first barrier layer.

7. The package structure of the flexible display device of claim 6, further comprising an encapsulation layer disposed between the first barrier layer and the second barrier layer, and disposed outside the flexible frontplane and the backplane.

8. The package structure of the flexible display device of claim 1, wherein at least one side of the first barrier layer aligns with the flexible frontplane, at least one side of the second barrier layer protrudes from the backplane, and at least one side of the second barrier layer protrudes from the first barrier layer.

9. The package structure of the flexible display device of claim 8, further comprising an encapsulation layer disposed on the second barrier layer, and disposed outside the flexible frontplane, the backplane and the first barrier layer.

10. The package structure of the flexible display device of claim 1, further comprising an adhesive layer disposed between the first barrier layer and the flexible frontplane.

11. The package structure of the flexible display device of claim 10, wherein at least one side of the adhesive layer protrudes from the flexible frontplane.

12. The package structure of the flexible display device of claim 1, further comprising an adhesive layer disposed between the second barrier layer and the backplane.

13. The package structure of the flexible display device of claim 12, wherein at least one side of the adhesive layer protrudes from the backplane.

14. The package structure of the flexible display device of claim 12, further comprising a bottom protection layer disposed between the adhesive layer and the backplane.

15. The package structure of the flexible display device of claim 12, wherein the second barrier layer is a composite barrier layer comprising at least one inorganic film and at least an organic substrate overlapping with each other.

16. The package structure of the flexible display device of claim 12, wherein the adhesive layer comprises a patterned adhesive layer.

17. A package structure of a flexible display device, comprising:
   a flexible opto-electronic display panel, comprising:
      a backplane, comprising a first surface and a second surface, the backplane comprising a display region and at least one bonding region defined on the first surface of the backplane, wherein the display region comprises an array layer;
      a flexible frontplane, facing the first surface of the backplane, wherein the flexible frontplane comprises a first surface and a second surface, and the second surface of the flexible frontplane faces the first surface of the backplane; and
      a display media layer, disposed between the flexible frontplane and the backplane, wherein the display media layer is substantially corresponding to the display region of the backplane, and at least one side of the display media layer aligns with one corresponding side of the backplane;

a first barrier layer, disposed on the first surface of the flexible frontplane, wherein the flexible frontplane, the display media layer and the first barrier layer expose the bonding region of the backplane;

a top protection layer, disposed on the first barrier layer, wherein at least one side of the first barrier layer and at least one side of the top protection layer align with the display media layer; and an exterior film, disposed on the top protection layer, wherein at least one side of the exterior film protrudes from the top protection layer.

18. The package structure of the flexible display device of claim 17, further comprising an encapsulation layer disposed between the exterior film and the backplane, and disposed outside the top protection layer, the first barrier layer, the flexible frontplane and the display media layer.

19. The package structure of the flexible display device of claim 17, wherein the exterior film has at least one of the effects including anti-glare, anti-reflection, anti-smudge and anti-wear.

20. The package structure of the flexible display device of claim 17, further comprising a supporting substrate disposed between the flexible frontplane and the first barrier layer.

21. The package structure of the flexible display device of claim 17, further comprising a second barrier layer disposed between the first barrier layer and the top protection layer.

22. The package structure of the flexible display device of claim 21, wherein at least one side of the second barrier layer aligns with one corresponding side of the first barrier layer.

* * * * *